US008859379B2

(12) United States Patent
Cheng et al.

(10) Patent No.: US 8,859,379 B2
(45) Date of Patent: Oct. 14, 2014

(54) STRESS ENHANCED FINFET DEVICES

(71) Applicant: International Buisness Machines Corporation, Armonk, NY (US)

(72) Inventors: Kangguo Cheng, Schenectady, NY (US); Balasubramanian S. Haran, Watervliet, NY (US); Shom Ponoth, Gaithersburg, MD (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/840,069

(22) Filed: Mar. 15, 2013

(65) Prior Publication Data
US 2014/0264598 A1    Sep. 18, 2014

(51) Int. Cl.
H01L 21/336    (2006.01)
H01L 27/12    (2006.01)
H01L 29/66    (2006.01)

(52) U.S. Cl.
CPC ...... *H01L 27/1211* (2013.01); *H01L 29/66795* (2013.01)
USPC ...................................................... 438/301

(58) Field of Classification Search
CPC ................. H01L 27/1211; H01L 29/666795; H01L 21/823431; H01L 21/823821; H01L 21/845; H01L 29/7831; H01L 29/785; H01L 29/786
USPC ................................................. 438/300, 301
See application file for complete search history.

(56) References Cited

U.S. PATENT DOCUMENTS

| | | | |
|---|---|---|---|
| 6,858,478 B2 | 2/2005 | Chau et al. | |
| 7,456,476 B2 | 11/2008 | Hareland et al. | |
| 7,531,423 B2 | 5/2009 | Cheng et al. | |
| 7,687,862 B2 | 3/2010 | Huebinger et al. | |
| 7,750,410 B2 | 7/2010 | Belyansky et al. | |
| 7,915,693 B2 | 3/2011 | Okano | |
| 8,003,458 B2 | 8/2011 | Huebinger et al. | |
| 8,263,451 B2 | 9/2012 | Su et al. | |
| 2011/0147840 A1 | 6/2011 | Cea et al. | |
| 2011/0298058 A1 | 12/2011 | Kawasaki et al. | |
| 2012/0018730 A1* | 1/2012 | Kanakasabapathy et al. | .. 257/66 |

OTHER PUBLICATIONS

Liow, T., et al., "Strain Enhancement in Spacerless N-Channel FinFETs with Silicon-Carbon Source and Drain Stressors," 37th European Solid State Device Research Conference, ESSDERC, Sep. 11-13, 2007, pp. 151-154, 1-4244-1124-6/07, copyright 2007 IEEE.

* cited by examiner

*Primary Examiner* — William D Coleman
(74) *Attorney, Agent, or Firm* — Thomas Grzesik; Fleit Gibbons Gutman Bongini & Bianco PL

(57) ABSTRACT

A non-planar semiconductor with enhanced strain includes a substrate and at least one semiconducting fin formed on a surface of the substrate. A gate stack is formed on a portion of the at least one semiconducting fin. A stress liner is formed over at least each of a plurality of sidewalls of the at least one semiconducting fin and the gate stack. The stress liner imparts stress to at least a source region, a drain region, and a channel region of the at least one semiconducting fin. The channel region is located in at least one semiconducting fin beneath the gate stack.

12 Claims, 6 Drawing Sheets

STRESS ENHANCED FINFET DEVICES

BACKGROUND

The present invention generally relates to semiconductor devices, and more particularly relates finFET devices with enhanced strain, and methods for fabricating the same.

As integrated circuits continue to scale downward in size, the finFET (fin field effect transistor) is becoming an attractive device for use with smaller nodes, e.g., the 22 nm node and beyond. In a finFET, the channel is formed by a semiconductor fin and a gate electrode is located on at least two sides of the fin. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device generally has faster switching times, equivalent or higher current density, and much improved short channel control than planar CMOS technology utilizing similar critical dimensions. However, one main detractor for realizing such finFET device technology is the ineffectiveness of conventional stress elements that are applied to such devices.

BRIEF SUMMARY

In one embodiment, a method for fabricating a non-planar semiconductor structure is disclosed. The method comprises forming at least one semiconducting fin on a surface of a semiconductor substrate. A gate stack is located on a portion of the at least one semiconducting fin. A semiconductor material is epitaxially grown on at least each of a plurality of sidewalls of the at least one semiconducting fin. After the semiconductor material is epitaxially grown a source region and a drain region are formed in the at least one semiconducting fin. After forming the source and drain regions the epitaxial grown semiconductor material is removed. A stress liner is formed over at least each of the plurality of sidewalls of the at least one semiconducting fin and the gate stack after the epitaxial grown semiconductor material has been removed. The stress liner imparts stress to the source region, the drain region, and a channel of the at least one semiconducting fin. The channel is located beneath the gate stack.

In another embodiment, a non-planar semiconductor is disclosed. The non-planar semiconductor structure comprises a substrate and at least one semiconducting fin formed on a surface of the substrate. A gate stack is formed on a portion of the at least one semiconducting fin. A stress liner is formed over at least each of a plurality of sidewalls of the at least one semiconducting fin and the gate stack. The stress liner imparts stress to at least a source region, a drain region, and a channel region of the at least one semiconducting fin. The channel region is located in at least one semiconducting fin beneath the gate stack.

In yet another embodiment, an integrated circuit is disclosed. The integrated circuit comprises at least one transistor. The at least one transistor comprises a substrate and at least one semiconducting fin formed on a surface of the substrate. A gate stack is formed on a portion of the at least one semiconducting fin. A stress liner is formed over at least each of a plurality of sidewalls of the at least one semiconducting fin and the gate stack. The stress liner imparts stress to at least a source region, a drain region, and a channel region of the at least one semiconducting fin. The channel region is located in at least one semiconducting fin beneath the gate stack.

In a further embodiment, a method for fabricating a non-planar semiconductor structure is disclosed. The method comprises forming at least one semiconducting fin on a surface of a semiconductor substrate. A gate stack is located on a portion of the at least one semiconducting fin. At least a portion of the at least one semiconducting fin is doped using a plasma doping process. The plasma doping forms a source region and a drain region in the at least one semiconducting fin. After the plasma doping, a stress liner is formed over at least each of the plurality of sidewalls of the at least one semiconducting fin and the gate stack. The stress liner imparts stress to the source region, the drain region, and a channel of the at least one semiconducting fin, where the channel is located beneath the gate stack.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

In accordance with one or more embodiments, methods and structures for forming non-planar semiconductor structures with enhanced strain are disclosed. It is to be understood that various embodiments are described in terms of a given illustrative architecture having a semiconductor-on-insulator (SOI) wafer; however, other architectures, structures, substrate materials and process features and steps may be varied within the scope of the present invention.

Figure 1:
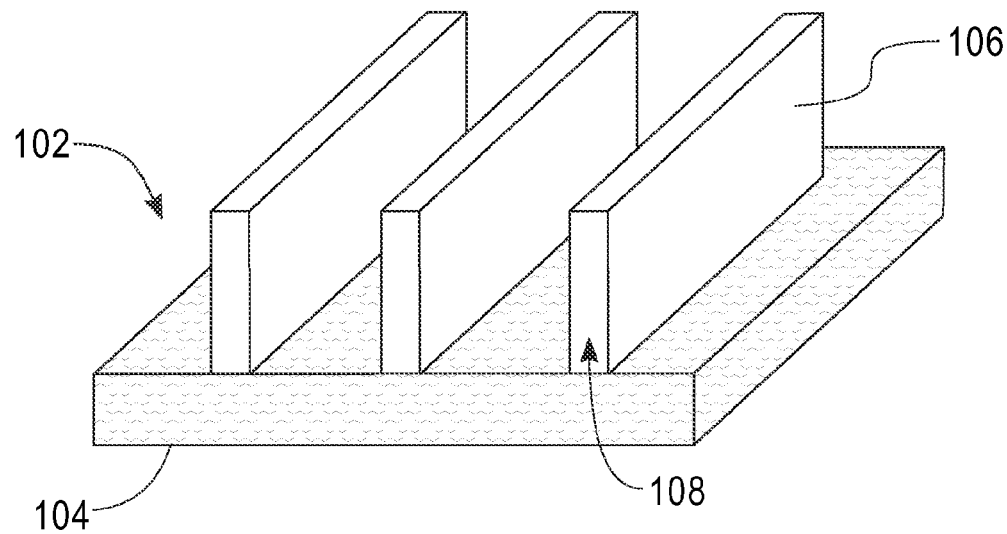
FIG. 1 is an isometric view of a semiconductor structure comprising a plurality of semiconducting fins according to one embodiment of the present invention.

Referring now to the drawings in which like numerals represent the same or similar elements, FIG. 1 shows an isometric view of an initial semiconductor structure 102. The structure 102 comprises a substrate 104 with a plurality of semiconductor fins 106 overlying the substrate 104. Although three fins 106 are shown, it should be understood that the plurality of fins 106 can be any number of fins. It should also be noted that even though following figures only illustrate a structure for a single finFET region of a wafer, the following discussion also applies to multiple finFETs regions of a wafer.

The substrate 104, in one embodiment, comprises a buried oxide layer (BOX), silicon (Si), silicon germanium (SiGe), and/or the like. Each of the fins 106 comprises a semiconductor-on-insulator (SOI) material 108 such as, but not limited to silicon (Si). However, in another embodiment, the substrate 104 is a bulk semiconductor substrate. In one embodiment, the fins 106 comprise an insulator material (not shown) formed on a top surface of each fin. The insulator material can be, for example, an oxide that is utilized as a hard mask or capping layer.

In various embodiments, the fins 106 can be formed by deposition of the SOI material 108 and optional insulator material using, for example, a conventional deposition process such as (but not limited to) chemical vapor deposition (CVD). Once the materials 104, 108 are deposited a patterning process can be performed to form the fins 106. For example, a lithographic and etching process can be utilized where a resist is applied, exposed, and developed. The SOI material 108 and optional oxide are then etched in accordance with the resist pattern down to the BOX layer (not shown) of the substrate 104. In another embodiment, a Sidewall Image Transfer (SIT) process can also be utilized. However, other methods for forming the fins 106 are applicable as well.

Figure 2:
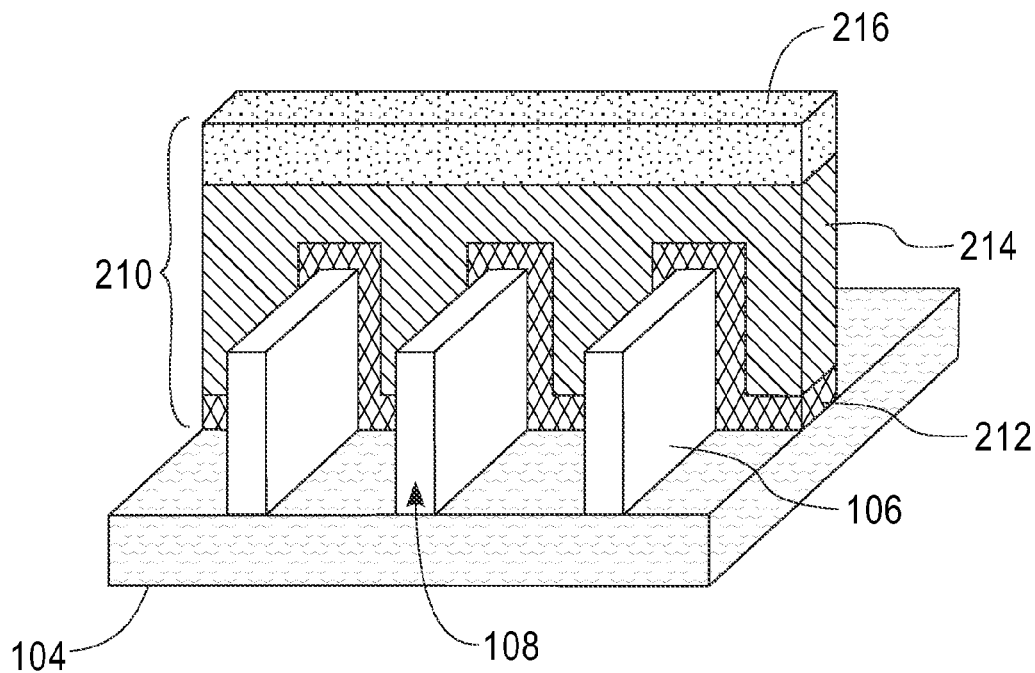
FIG. 2 is an isometric view of the semiconductor structure comprising a gate stack formed over the plurality of semiconducting fins according to one embodiment of the present invention.

FIG. 2 shows an isometric view of the structure of FIG. 1 after application of a gate stack 210. The structure of FIG. 2, in one embodiment, is achieved by depositing a thin conformal layer of gate dielectric and thick layers of gate conductor material and nitride (or the like). A resist is then applied, exposed, and developed. The gate dielectric, gate conductor, and nitride layers are then selectively etched with respect to the fins 106 and optional fin cap in accordance with the patterned resist. This etching forms a discrete gate stack 210 comprising a gate dielectric layer 212, a gate conductor 214, and a cap 216. It should be noted that other methods for forming the gate stack are applicable as well. For example, a replacement metal gate process can also be utilized to form the gate stack 210. Also, in other embodiments, the gate stack 210 comprises a different structure that what is shown in FIG. 2.

Figure 3:
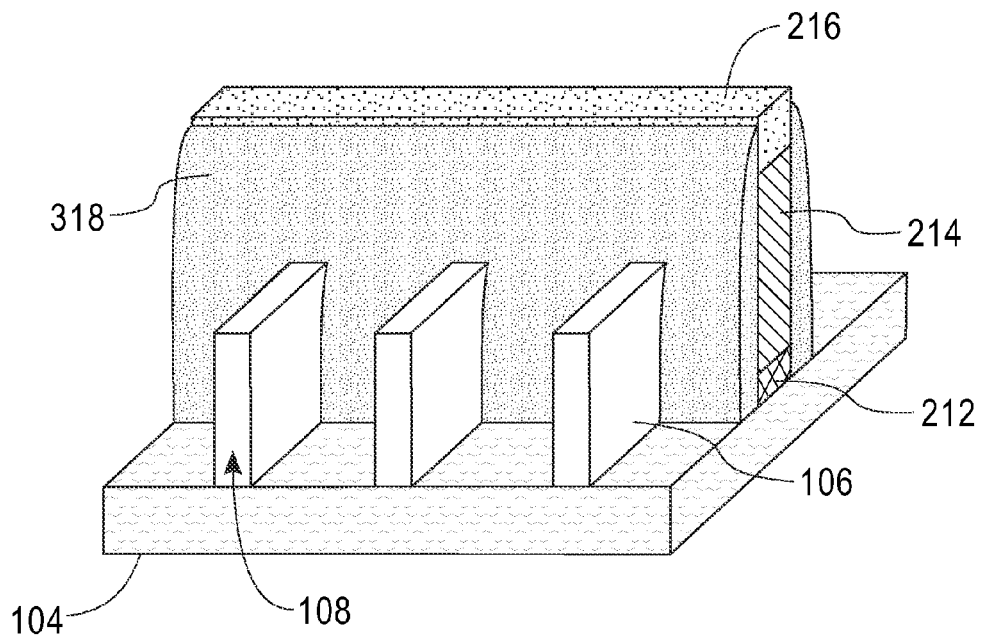
FIG. 3 is an isometric view of the semiconductor structure comprising a spacer formed around a gate stack according to one embodiment of the present invention.

FIG. 3 is an isometric view illustrating the addition of spacers 318 to the structure of FIG. 2. These spacers 318 are formed on both the gate stack 210 and fins 106 (and optional cap) by one or more spacer formation techniques. For example, a conformal layer of insulating material (e.g., silicon oxide, silicon nitride silicon oxynitride, and high-k dielectric material and the like) can be isotropically deposited followed by an anisotropic etch (e.g., reactive ion etch (RIE)) of that material to form spacers 318 on at least both sides of the gate stack 210, as shown in FIG. 3

Figure 4:
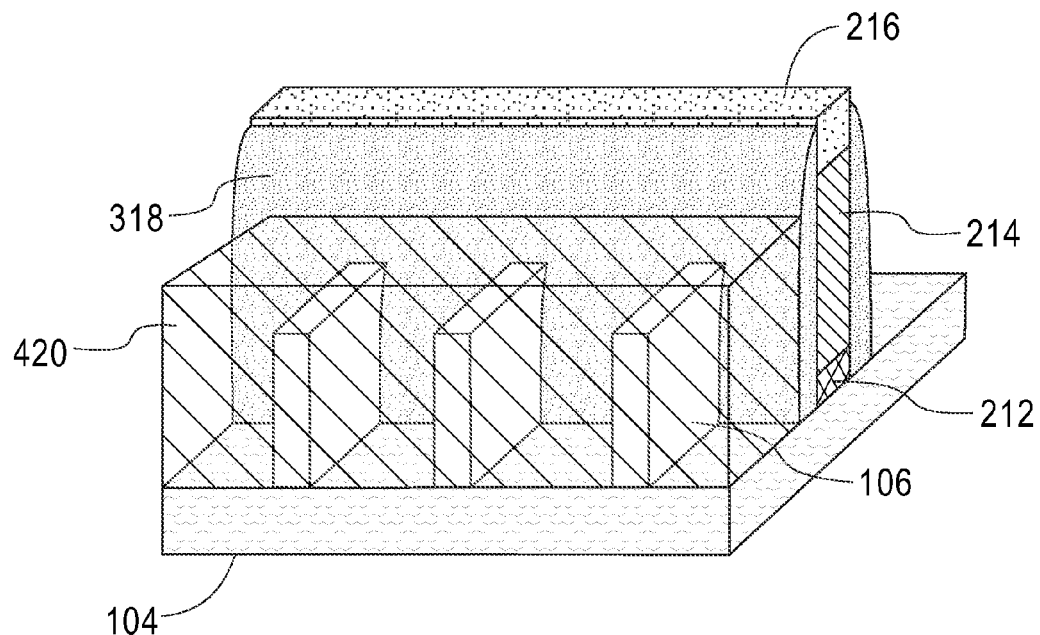
FIG. 4 is an isometric view of the semiconductor structure comprising an epitaxially grown semiconductor material grown on the plurality of semiconducting fins according to one embodiment of the present invention.

FIG. 4 is an isometric view illustrating the structure of FIG. 3 after an epitaxial merge process has been performed thereon to form source/drain regions within the semiconductor material 108 (e.g., silicon) of each fin 106. In this embodiment, a semiconductor material 420 such as (but not limited to) silicon germanium (SiGe) is epitaxially grown on the sidewalls and top surface of each of fin 106. For example, a selective epitaxy process can be used to grow SiGe 420 on the exposed Si surfaces of the fins. This selective epitaxy process does not grow SiGe 420 on dielectric layers, such as nitride or oxide. Therefore, in an embodiment where the fins 106 comprise a hard mask or capping layer on their top surface, SiGe 420 is only grown on the sidewalls of the fins 106.

In one embodiment, the epitaxially grown SiGe material 420 is doped by implantation, is in-situ doped during the SiGe epitaxy process, or is doped by other applicable techniques, where n-type species (e.g., phosphorus or arsenic) are used for n-finFET regions and p-type species (e.g., boron) are used for p-finFET regions. A high temperature anneal can then be performed to activate the dopants in the source-drain region of the fins 106. The diffusion of N-type species (e.g. Phosphorus or arsenic) and p-type species (e.g. Boron) from SiGe epitaxy into the fins 106 forms N+ and P+ source/drain regions respectively. It should be noted that while doping the p-finFET region the n-finFET region is masked and vice versa. It should also be noted that, in another embodiment, the epitaxial growth process is not required. For example, source/drain regions can be formed within each fin 106 by utilizing plasma doping and a subsequent anneal.

Figure 5:
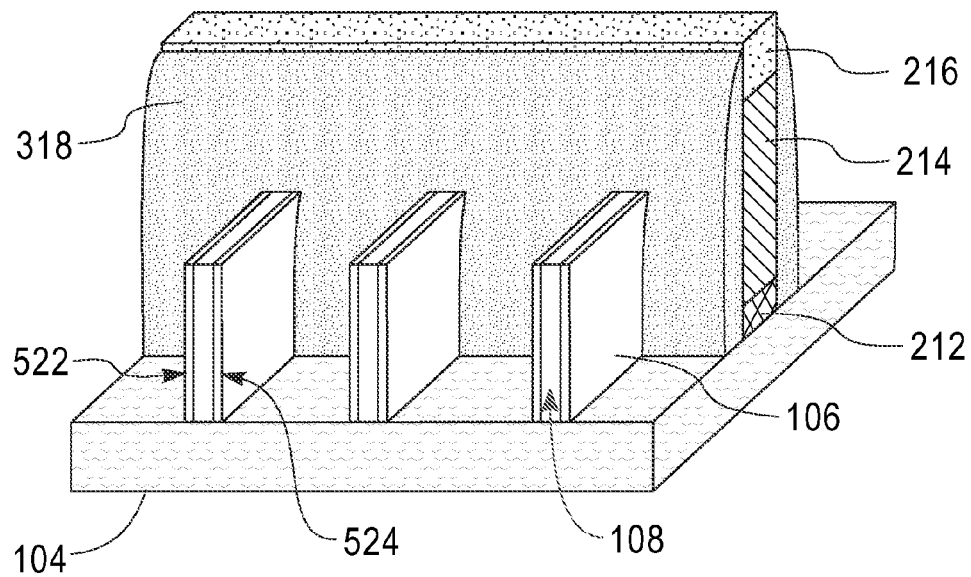
FIG. 5 is an isometric view of the semiconductor structure after the epitaxially grown semiconductor material has been removed and source/drain regions have been formed in each of on the plurality of semiconducting fins according to one embodiment of the present invention.

FIG. 5 is an isometric view illustrating the structure of FIG. 4 after a SiGe removal process has been performed and the source/drain regions 522, 524 of the fins 102 have been formed. In one embodiment, this SiGe removal process is selective to the semiconductor material (e.g., silicon) of the fins 106. For example, reactive-ion etching (RIE) can be utilized to remove the SiGe 420 from the structure. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. It should be noted that other techniques for selectively removing the SiGe are applicable as well.

Figure 6:
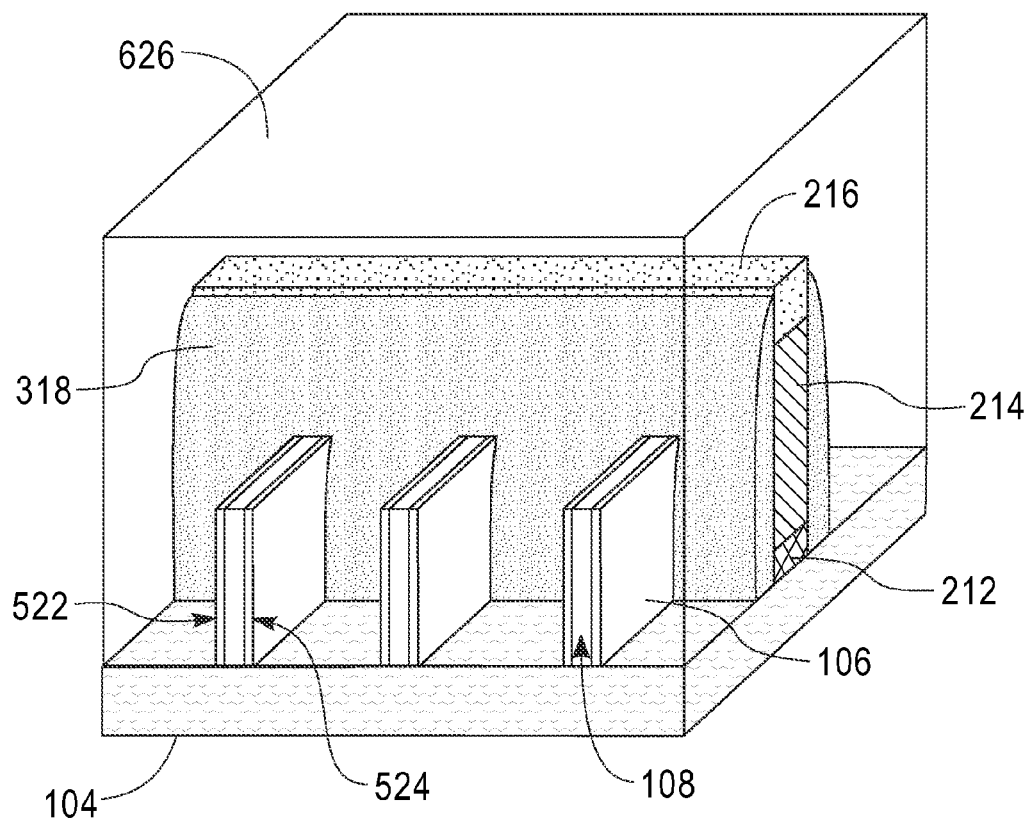
FIG. 6 is an isometric view of the semiconductor structure comprising a stress inducing material deposed over the plurality of fins and gate stack including the spacer according to one embodiment of the present invention.

In an embodiment where the fins 106 comprise the optional hard mask or capping layer the fins 106 are masked by this layer during the RIE process. After the SiGe 420 has been removed the capping layer is etched away as part of a replacement metal gate process. For example, if a capping layer is utilized on the fins 106, a replacement (dummy) gate stack is formed during the gate fabrication process discussed above. After the SiGe 420 has been removed the replacement gate is also removed along with the capping layer on the portion of the fins between the spacer 318. A metal gate is then formed similar to the process discussed above within the cavity created when the replacement gate was removed. One example of performing a replacement metal gate fabrication process is given in the commonly owned U.S. Patent Application entitled "Bulk Fin-Field Effect Transistors With Well Defined Isolation", Ser. No. 13/277,956, now U.S. Pat. No. 8,420,459, which is hereby incorporated FIG. 6 is an isometric view illustrating the structure of FIG. 5 after a stress inducting liner material has been formed/deposited over the structure. In one embodiment, the stress liner formation comprises forming a stress inducing film 626 on the surface of the structure and over/around the fins 106 and the gate stack 210 including the spacer 318, as shown in FIG. 6. The stress inducing film 626 can be either a compressive stress inducing film that induces a compressive stress on p-channel devices or a tensile stress inducing film that induces a tensile stress on n-channel devices.

The tensile stress inducing film can be a dielectric film that generates tensile stress on underlying structures. For example and in one embodiment, the tensile stress inducing film can be a tensile silicon nitride film. The tensile stress inducing film can be formed by plasma enhanced chemical vapor deposition (PECVD) or high density plasma chemical vapor deposition (HDPCVD) at a temperature ranging from 400° C. to 600° C.

Compressive stress inducing films that can be employed include a dielectric material that generates a compressive stress on an underlying structure, a refractory metal nitride such as, for example, TaN, TiN, WN, MoN, NbN, ReN, or a combination thereof. In some embodiments, the compressive stress inducing film is a comprised of a compressive nitride. The compressive stress inducing film can be formed by chemical vapor deposition (CVD), physical vapor deposition (PVD), plasma enhanced chemical vapor deposition (PECVD) or high density plasma chemical vapor deposition (HDPCVD).

Figure 7:
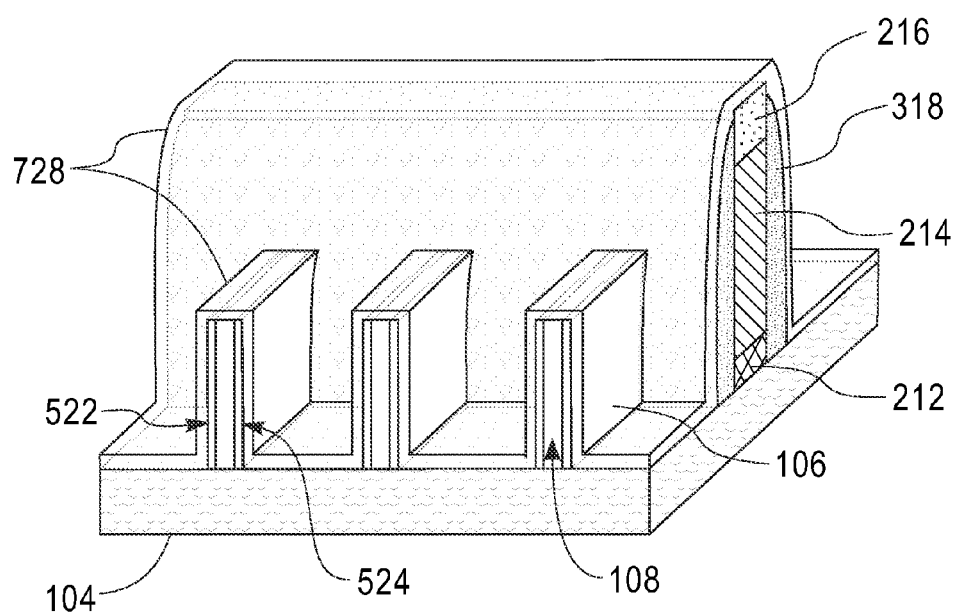
FIG. 7 is an isometric view of the semiconductor structure after the stress inducing material has been etched to form a stress liner over the plurality of fins and gate stack including the spacer according to one embodiment of the present invention.

Once the stress inducing film 626 has been deposited an etching process is performed to etch away portions of the stress inducing film 626 to form a patterned stress generating liner 728, as shown in FIG. 7. The stress liner 728 is formed over/on the sidewalls and top surface of each fin 106, any exposed surface of the substrate 104 between the fins 106, the gate spacer 318, and any exposed surface of the gate stack 210. If a hard mask or capping layer is formed on top of the fins 106 the stress liner 728 is formed over/on this mask/layer. The stress liner 728 imparts a compressive/tensile stress on the source/drain regions 522, 524 of the fins 106 and the channel of each fin under the gate stack 210. Therefore, because the stress liner 728 wraps around the fins 106 the resulting structure comprises enhances stress coupling to the channel, which provides improved carrier mobility.

It one embodiment, a single stress liner 728 comprising, silicon nitride can be utilized to provide tensile or compressive strain. The type of magnitude of the strain can be adjusted by varying the deposition conductions such as temperature. However, in other embodiment, different stress liners can be formed on p-finFET and n-finFET regions. For example, after a compressive (or tensile) stress liner is formed for a p-finFET (or n-finFET) region a block mask is formed over the p-finFET (or n-finFET) region. An etching process such as a dry etching is employed to remove the compressive stress liner from the n-finFET (or p-finFET) region not protected by the block mask. A tensile (or compressive) stress inducing stress liner is formed over the n-finFET (or p-finFET) region similar to the above. It should be noted that a tensile (or comprises) stress inducing film can be formed prior to the compressive (or tensile) stress inducing film using the process above. Also, a mask can first be employed over a finFET region prior to any stress inducing film being deposited. In this embodiment, only the unmasked finFET region is covered by the film. It should also be noted that other techniques for forming a stress inducing film are applicable as well.

Figure 8:
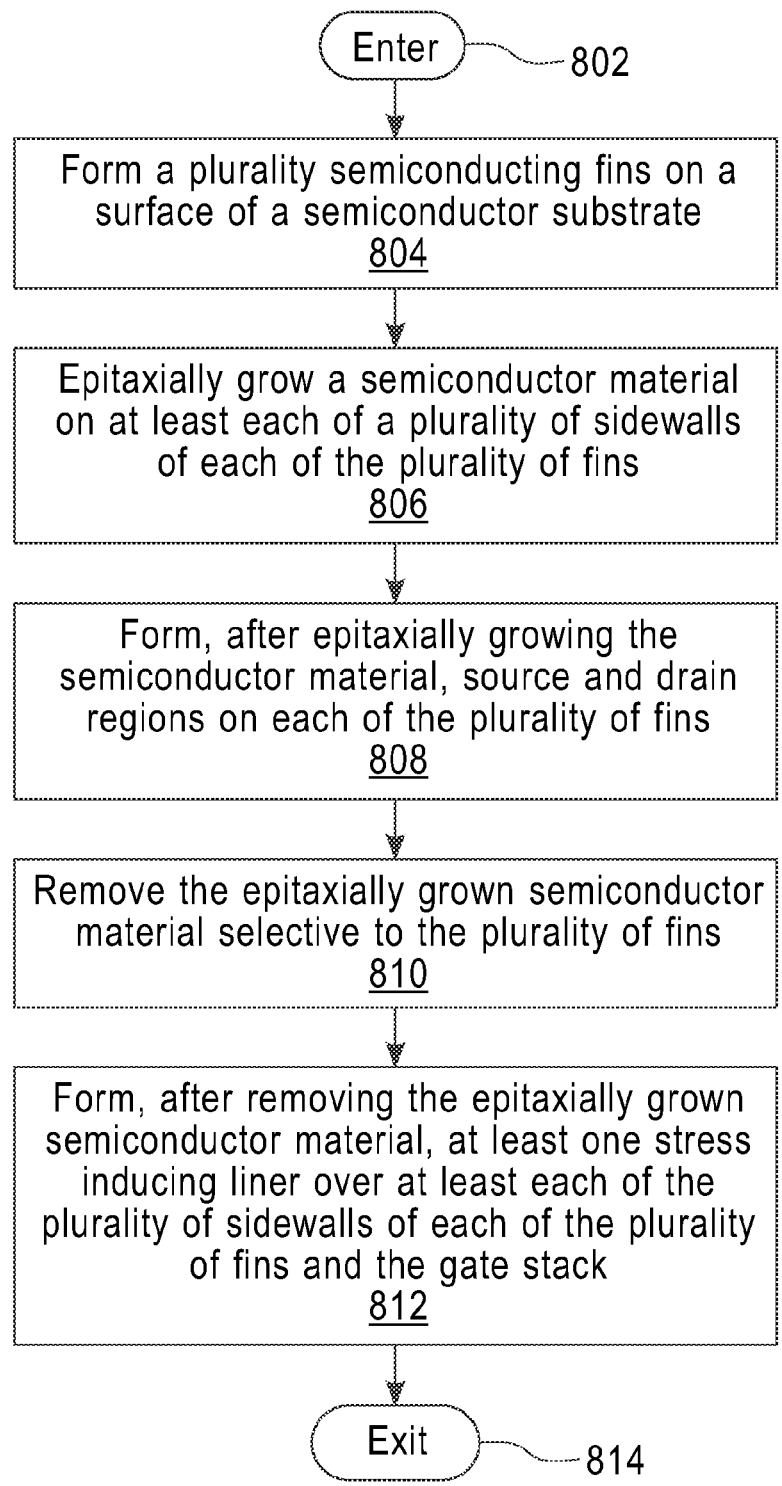
FIG. 8 is an operational flow diagram illustrating one example of a process for fabricating a non-planer semiconductor structure with enhanced stress according to one embodiment of the present invention.

FIG. 8 is an operational flow diagram illustrating a process for fabricating a non-planar semiconductor structure with enhanced strain. The operational flow diagram of FIG. 8 begins at step 802 and flows directly to step 804. A plurality of semiconducting fins 106, a step 804, is formed on a surface of a semiconductor substrate 104. A gate stack 210 is located on a portion of each of the semiconductor fins 106. A semiconductor material 420, at step 806, is epitaxially grown on at least each of a plurality of sidewalls of each of the plurality of fins 106. After epitaxially growing the semiconductor material 420, source and drain regions 522, 524, at step 808, are formed in each of the plurality of fins 106. The epitaxially grown semiconductor material 420, at step 810, is removed selective to the plurality of fins 106. After removing the epitaxially grown semiconductor material 420 at least one stress inducing liner 728, at step 812, is formed over at least each of the plurality of sidewalls of each of the plurality of fins 106 and the gate stack 210. The at least one stress inducing liner 728 imparts a stress to a channel region of each of the plurality of semiconductor fins 106 that is located beneath the gate stack 210. The control flow exits at step 814.

Figure 9:
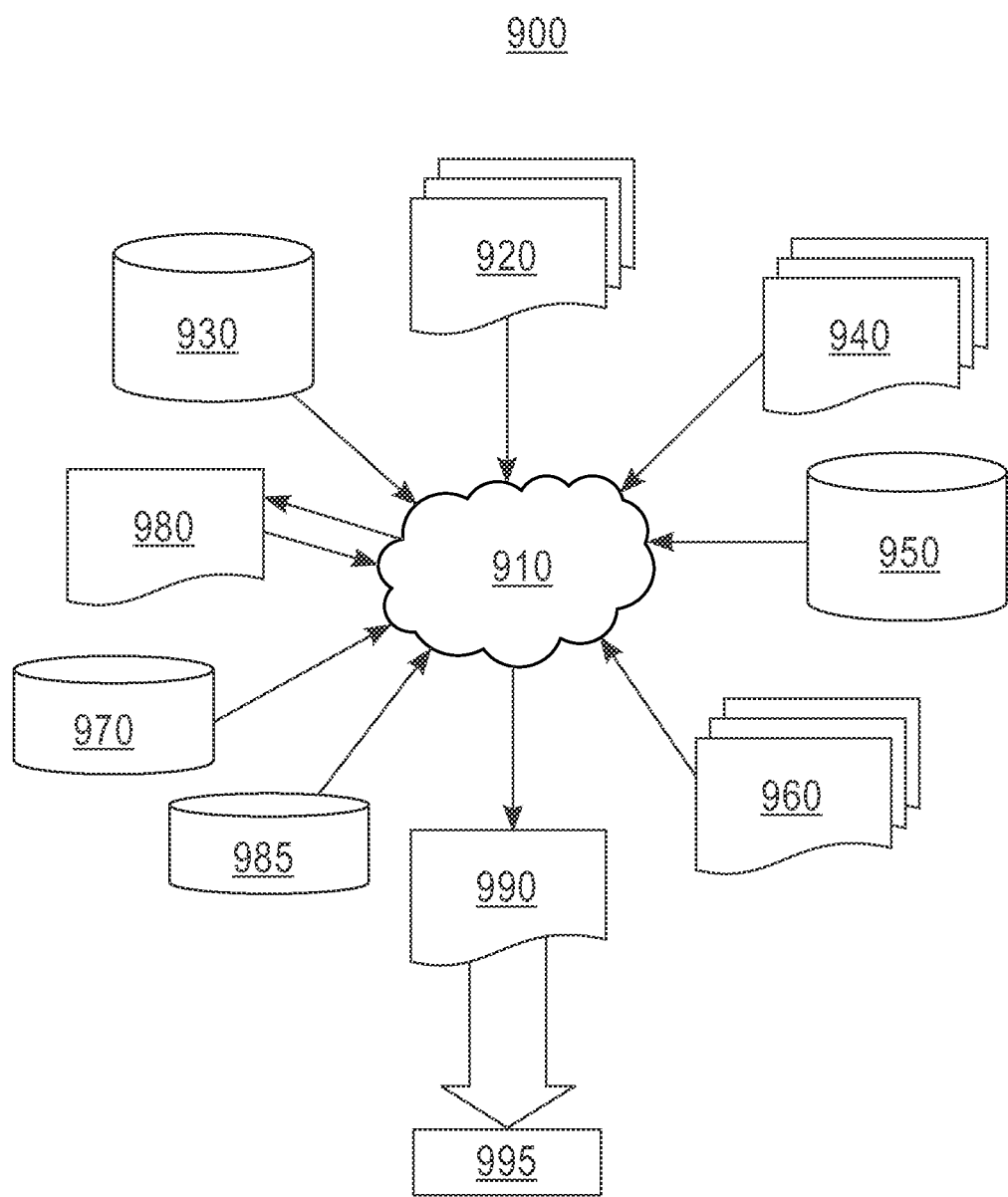
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-7. The design structures processed and/or generated by design flow 900 may be encoded on computer-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 1210 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating a non-planar semiconductor structure, the method comprising:
    forming at least one semiconducting fin on a surface of a semiconductor substrate, wherein a gate stack is located on a portion of the at least one semiconducting fin;
    epitaxially growing a semiconductor material on at least each of a plurality of sidewalls of the at least one semiconducting fin;
    forming, after the semiconductor material is epitaxially grown, a source region and a drain region in the at least one semiconducting fin;
    removing, after forming the source and drain regions, the epitaxial grown semiconductor material; and
    forming, after the epitaxial grown semiconductor material has been removed, a stress liner over and in contact with at least each of the plurality of sidewalls of the at least one semiconducting fin and over in contact with the gate stack, wherein the stress liner imparts stress to the source region, the drain region, and a channel of the at least one semiconducting fin, wherein the channel is located beneath the gate stack.

2. The method of claim 1, wherein forming the stress liner comprises:
    forming the stress liner on a top surface of the at least one semiconducting fin.

3. The method of claim 1, wherein the at least one semiconducting fin comprises an insulating layer formed on a top surface of the at least one semiconducting fin, and wherein the stress liner is further formed on the insulating layer.

4. The method of claim 1, wherein the epitaxial grown semiconductor material comprises silicon germanium.

5. The method of claim 1, wherein the stress liner comprises silicon nitride.

6. The method of claim 1, wherein the stress liner is a tensile stress liner.

7. The method of claim 1, wherein the stress liner is a compressive stress liner.

8. A method for fabricating a non-planar semiconductor structure, the method comprising:
    forming at least one semiconducting fin on a surface of a semiconductor substrate, wherein a gate stack is located on a portion of the at least one semiconducting fin;
    plasma doping at least a portion of the at least one semiconducting fin, the plasma doping forming a source region and a drain region in the at least one semiconducting fin; and
    forming, after the plasma doping, a stress liner over and in contact with at least each of the plurality of sidewalls of the at least one semiconducting fin and over and in contact with the gate stack, wherein the stress liner imparts stress to the source region, the drain region, and a channel of the at least one semiconducting fin, wherein the channel is located beneath the gate stack.

9. The method of claim 8, wherein forming the stress liner comprises:
    forming the stress liner on a top surface of the at least one semiconducting fin.

10. The method of claim 8, wherein the at least one semiconducting fin comprises an insulating layer formed on a top surface of the at least one semiconducting fin, and wherein the stress liner is further formed on the insulating layer.

11. The method of claim 8, wherein the stress liner is a tensile stress liner.

12. The method of claim 8, wherein the stress liner is a compressive stress liner.

* * * * *